US006181604B1

United States Patent
Lu et al.

(10) Patent No.: US 6,181,604 B1
(45) Date of Patent: Jan. 30, 2001

(54) METHOD FOR FAST PROGRAMMING OF EPROMS AND MULTI-LEVEL FLASH EPROMS

(75) Inventors: Tao Cheng Lu, Kaohsiung; Wen Jer Tsai, Hsinchu; Mam Tsung Wang, Hsinchu; Chin Hsi Lin, Hsinchu; Ful Long Ni, Hsinchu, all of (TW)

(73) Assignee: Macronix International Co., Ltd., Hsinchu (TW)

( * ) Notice: Under 35 U.S.C. 154(b), the term of this patent shall be extended for 0 days.

(21) Appl. No.: 09/359,073

(22) Filed: Jul. 22, 1999

(51) Int. Cl.[7] .................................................. G11C 16/06
(52) U.S. Cl. ............................ 365/185.22; 365/185.05; 365/185.16; 365/185.02
(58) Field of Search ..................... 365/185.22, 185.02, 365/185.05, 185.16

(56) References Cited

U.S. PATENT DOCUMENTS

| | | | |
|---|---|---|---|
| 5,202,848 | 4/1993 | Nakagawara | 365/104 |
| 5,463,586 | 10/1995 | Chao et al. | 365/210 |
| 5,553,020 | 9/1996 | Keeney et al. | 365/185.19 |
| 5,563,822 | 10/1996 | Yiu et al. | 365/185.14 |
| 5,590,076 | 12/1996 | Haddad et al. | 365/185.25 |
| 5,677,216 | 10/1997 | Tseng | 437/43 |
| 5,734,602 | * 3/1998 | Guritz et al. | 365/104 |
| 5,959,892 | * 9/1999 | Lin et al. | 365/185.28 |
| 6,064,592 | * 5/2000 | Nakagawa et al. | 365/185.05 |

* cited by examiner

Primary Examiner—Richard Elms
Assistant Examiner—Hien Nguyen
(74) Attorney, Agent, or Firm—Beyer Weaver & Thomas, LLP

(57) ABSTRACT

A method for programming a semiconductor memory device, such as an EPROM or a Flash EPROM, which combines the advantages of ramping down a source voltage with the advantages associated with increasing a gate voltage. A programming period is divided into a program disturbance inhibited period and a program period. The programming period is further divided into sub-program periods, with each sub-program period having a program disturbance and a program period. A wordline WL voltage may increase with each sub-program period to improve the programming speed. Also, the program disturbance period may only be performed for the first sub-program period. Each sub-program period may also include a verify period, in order to implement a program and verify technique suitable for programming multi-level Flash EPROMS.

24 Claims, 5 Drawing Sheets

METHOD FOR FAST PROGRAMMING OF EPROMS AND MULTI-LEVEL FLASH EPROMS

CROSS-REFERENCE TO RELATED APPLICATIONS

The present application is related to U.S. Patent Application entitled "VIRTUAL GROUND EPROM STRUCTURE" filed concurrently herewith on Jul. 22, 1999, U.S. patent application Ser. No. 09/359,197; and to U.S. patent application Ser. No. 08/918,796, entitled "APPARATUS AND METHOD FOR PROGRAMMING VIRTUAL GROUND EPROM ARRAY CELL WITHOUT DISTURBING ADJACENT CELLS" filed Aug. 26, 1997, now a U.S. Pat. No. 5,959,892 both applications being assigned to the assignee of the present invention, and herein incorporated by reference.

BACKGROUND OF THE INVENTION

1. Field of the Invention

The present invention relates to generally to semiconductor memory devices and, more particularly, to a method for programming EPROMS and multi-level Flash EPROMS.

2. Description of the Related Art

Erasable programmable read only memory (EPROM), electronically erasable programmable read only memory (EEPROM) and Flash memory are classes of floating gate memory devices. More particularly, these floating gate memory devices are programmable memory devices which use floating gates as charge storage layers. These devices are based on a memory transistor, consisting of a source, channel, and a drain with a floating gate over the channel and a control gate isolated from the floating gate. Programming a cell requires charging the floating gate with electrons, which increases the turn on threshold of the memory cell. Flash EPROMS typically use a "hot electron" programming technique to charge the cells. When programmed, the cell will not turn on, i.e. it remains non-conductive, if a read potential is applied to its control gate. To erase the cell, electrons are removed from the floating gate in order to lower the threshold. With a lower threshold, the cell will now turn on when a read potential is applied to the control gate.

Conventionally, hot electron programming is performed by ramping up the drain voltage or the gate voltage. In other words, the source voltage is first shorted to ground, and then the drain (or gate) voltage is increased. Finally, the gate (or drain) voltage is applied. One programming method which operates by varying the gate voltage has been disclosed in U.S. Pat. No. 5,563,822, the disclosure of which is hereby incorporated by reference. However, this programming method has low programming efficiency and a large leakage current is induced by the drain-turn-on or punch-through problems of the unselect cells. Two proposals to overcome these problems include U.S. Pat. No. 5,553,020, disclosing a programming method that applies a source bias, and U.S. Pat. No. 5,590,076, disclosing a constant current source programming method.

More recently, memory cells have included multiple levels in order to provide more data storage. For instance, instead of having only two threshold states, a larger number of threshold states are now being used and sensed as separate data levels. This allows for increased data storage for a given amount of memory. The addition of multiple levels increases the programming problems associated with the prior art solutions, since multiple levels are already more difficult to program.

In the view of the foregoing, there is a need for faster and more efficient schemes for programming erasable programmable memory cells, especially for multi-level Flash EPROMS.

SUMMARY OF THE INVENTION

The present invention is a method for programming a semiconductor memory device, which combines the advantages of ramping down a source voltage with the advantages associated with increasing a gate voltage. A programming period is divided into a program disturbance inhibited period and a program period. During a program disturbance inhibited period, a ground line GL is first pulled high, then a data line DL is pulled up, and finally a word line WL voltage is pulled up. Under these conditions, the data line DL and the ground line GL are kept at a high voltage to inhibit programming during this period. In addition, the corresponding BWL and DWL/DWR lines are turned on to prevent any voltages from disturbing the adjacent cells during the following programming period.

During the programming period, the ground line GL is pulled down and the corresponding BWL line is turned on to generate a high electric field between the drain and the source of the programmed cell, in order to perform hot electron programming. A programming method performed by ramping down the source bias is thereby achieved.

In a second embodiment, the programming period is further divided into sub-program periods, with each sub-program period having a program disturbance and a program period. The wordline WL voltage may increase with each sub-program period to improve the programming speed. Also, the program disturbance period may only be performed for the first sub-program period.

In another embodiment, each sub-program period may also include a verify period, in order to implement a program and verify technique suitable for programming multi-level Flash EPROMS.

The programming method of the present invention is thus able to combine the advantages associated with ramping down a source voltage with the advantages associated with increasing a gate voltage. The programming method is also especially suited for programming virtual ground EPROM devices.

BRIEF DESCRIPTION OF THE DRAWINGS

The present invention will be readily understood by the following detailed description in conjunction with the accompanying drawings, wherein like reference numerals designate like structural elements, and in which.

DETAILED DESCRIPTION OF THE INVENTION

The following description is provided to enable any person skilled in the art to make and use the invention and sets forth the best modes contemplated by the inventor for carrying out the invention. Various modifications, however, will remain readily apparent to those skilled in the art, since the basic principles of the present invention have been defined herein specifically to provide a method for fast programming of EPROMS and multi-level Flash EPROMS.

Figure 1:
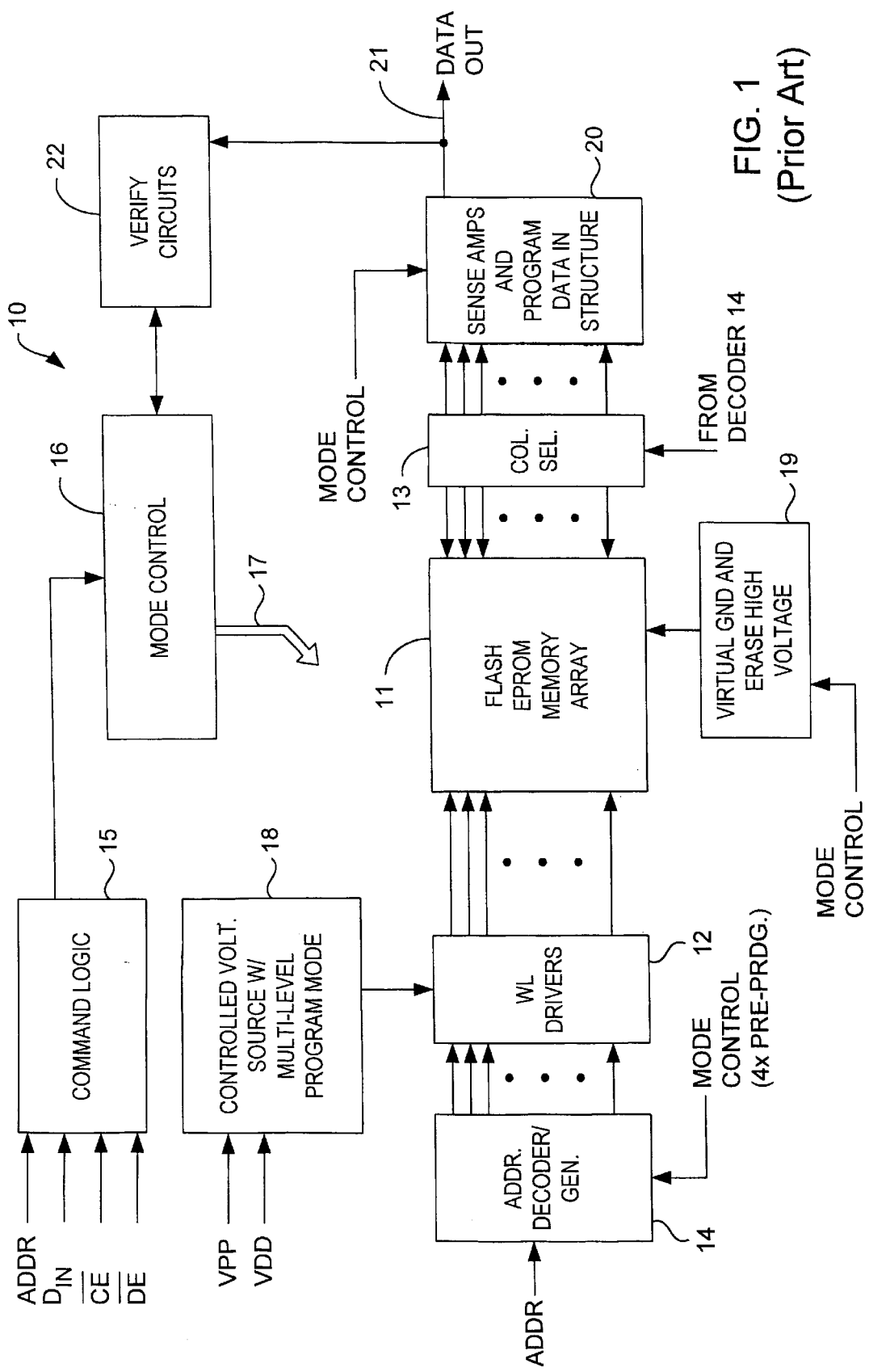
FIG. 1 is block diagram of a prior art Flash EPROM structure.

FIG. 1 illustrates a flash EPROM memory array that includes a plurality of modes, including a read mode, a program mode, a program and verify mode and erase verify mode. This device is described in detail in U.S. Pat. No. 5,563,822, herein incorporated by reference. In order to obtain the most efficient cell size, a virtual ground array structure is preferred for the memory array 11. For example, FIG. 2 illustrates a preferred virtual ground array structure, the construction of which is described in detail in the related application entitled VIRTUAL GROUND EPROM STRUCTURE referenced above.

Figure 2:
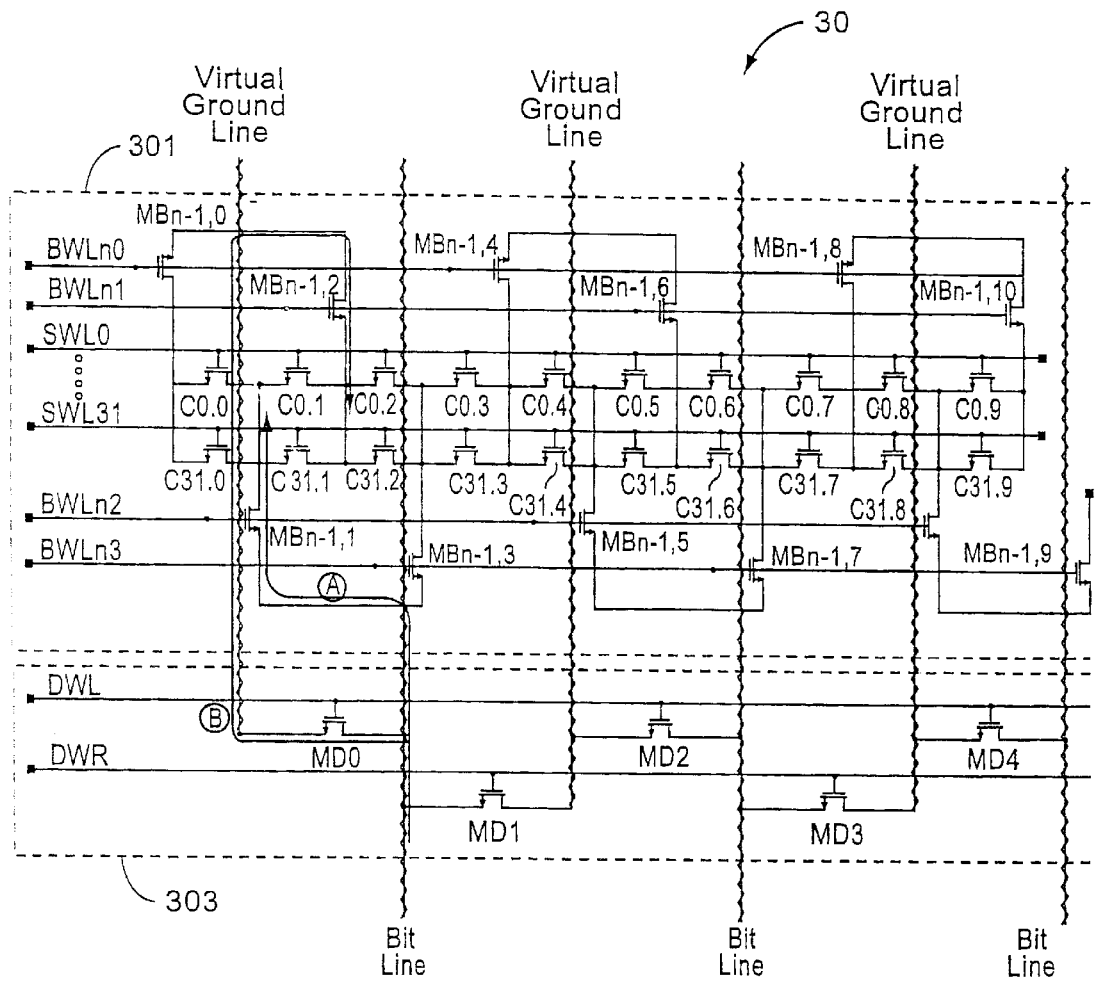
FIG. 2 is a schematic of a preferred virtual ground array structure for use with the present invention.

A virtual ground EPROM structure 30 preferred for use with the present invention is illustrated in FIG. 2. The structure 30 includes a program disturb inhibited unit 303 comprising disturbance inhibited transistors MD0–MD4 that are controlled by dummy word lines DWR and DWL. The program disturb inhibited unit 303 is operatively connected to a memory array 301. The memory array 301 comprises a plurality of floating gate memory cells C0,0–C31,9, each cell connected to a cell word line SWL0–SWL31. The floating gate memory cells are coupled source to drain to form the rows of memory cells. The control gates of the memory cells are coupled to the same wordline. Two bit line selection transistors BLTs (i.e. MBn-1,0 and MBn1,2), also known as band select transistors, are connected to each metal line (ground or bit line), which allows the cell size to be reduced. The virtual ground lines are connected to the sources of the BLTs, whereas the bit lines are connected to the drains of the BLTs. Four block selection lines (BWL) BWLn0–BWLn3 control the bit line selection transistors MBn-1,0–MBn-1,9. Also, in the present structure 30, one metal pitch is connected to two buried diffusion lines. This structure 30 can prevent programming disturbances on adjacent cells, as described below.

For a read operation, DWR and DWL are low and the program disturb inhibited unit 303 is turned off. The BWL decoding method is listed below:

| Cell | BWLn0 | BWLn1 | BWLn2 | BWLn3 |
|------|-------|-------|-------|-------|
| C0.0 | on | off | on | off |
| C0.1 | off | on | on | off |
| C0.2 | off | on | off | on |
| C0.3 | on | off | off | on |

Figure 3:
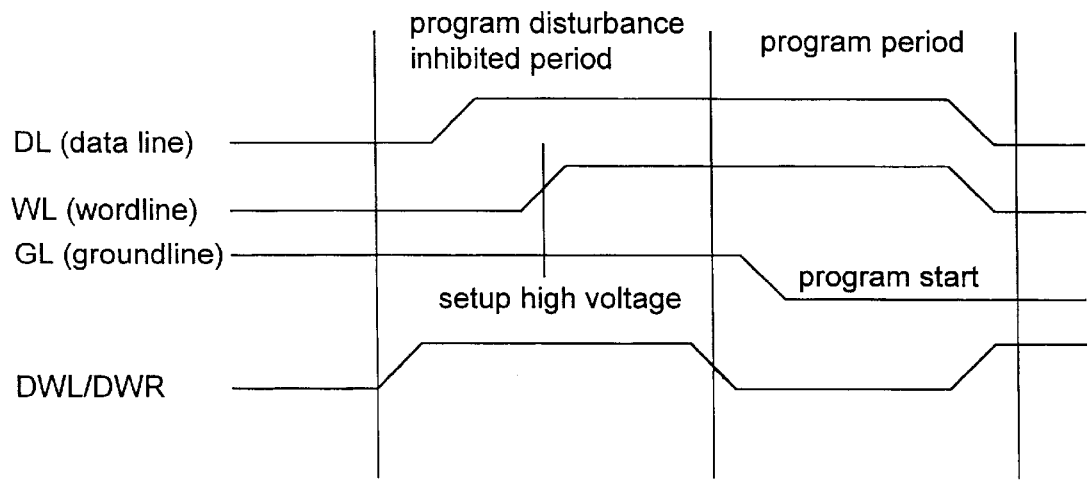
FIG. 3 is a timing diagram illustrating the division of the program pulses into a program disturbance inhibited period and a program period.

In order to perform a programming operation, the program pulses are divided into a program disturbance inhibited period and a programming period as shown in FIG. 3. During a program disturbance inhibited period, the ground line GL is first pulled high, then the data line DL (i.e. a bit line in FIG. 2) is pulled up, and finally the word line voltage is pulled up. Under these conditions, the data line DL and the ground line GL are kept at a high voltage to inhibit programming during this period. In addition, the corresponding BWL and DWL/DWR lines are turned on to prevent any voltages from disturbing the adjacent cells during the following programming period. During the programming period, the ground line GL is pulled down and the corresponding BWL line is turned on to generate a high electric field between the drain and the source of the programmed cell, in order to perform hot electron programming. A programming method performed by ramping down the source bias is thereby achieved.

The corresponding BWL and DWL/DWR decoding scheme during the program disturbance inhibited period is listed below:

| Cell | BWLn0 | BWLn1 | BWLn2 | BWLn3 | DWL | DWR |
|------|-------|-------|-------|-------|-----|-----|
| C0.0 | off | on | on | off | on | off |
| C0.1 | on | off | on | off | on | off |
| C0.2 | on | off | off | on | off | on |
| C0.3 | off | on | off | on | on | off |

For example, in order to program cell C0,0 without disturbing C0,1, the drain sides of C0,0 and C0,1 are charged to a high voltage through path A by turning on BWLn2. However, the source side of C0,1 is charged to a high voltage through path B by turning on the DWL and BLWn1 lines. Therefore, the cell C0,1 will not be disturbed during the programming period.

The programming period is performed after the program disturbance inhibited period by pulling down source side of C0,0. During the programming period, the DWR and DWL lines are low and the BWL decoding scheme is the same as the read operation and is listed below:

| Cell | BWLn0 | BWLn1 | BWLn2 | BWLn3 |
|------|-------|-------|-------|-------|
| C0.0 | on | off | on | off |
| C0.1 | off | on | on | off |
| C0.2 | off | on | off | on |
| C0.3 | on | off | off | on |

Figure 4A:
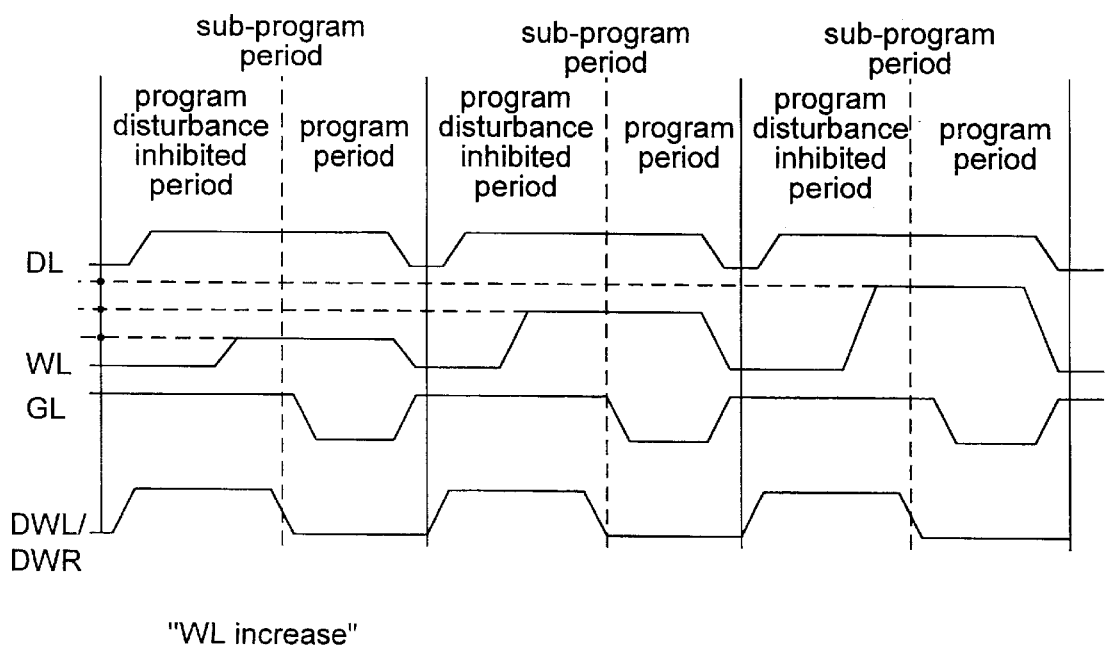
FIG. 4(a) illustrates the programming waveforms according to a first embodiment of the present invention.

The present invention proposes a fast programming method for the above-described structure by combining the advantages of ramping down the source voltage and increasing the gate voltage, while any programming disturbance for adjacent cells is inhibited. The proposed programming waveforms of the present invention are shown in FIG. 4(a). The complete program period can be divided into sub-program periods. Each sub-program period is identical to the period shown in FIG. 3, wherein each sub-program period is divided into a program disturbance inhibited period and a program period.

During a program disturbance inhibited period, the ground line GL is first pulled high, then the data line DL is pulled up, and finally the word line voltage is pulled up. Under these conditions, the data line DL and the ground line GL are kept at a high voltage to inhibit programming during this period. In addition, the corresponding BWL and DWL/DWR lines are turned on to prevent any voltages from disturbing the adjacent cells during the following programming period. During the programming period, the ground line GL is pulled down and the corresponding BWL line is turned on to generate a high electric field between the drain and the source of the programmed cell, in order to perform hot electron programming.

Figure 4B:
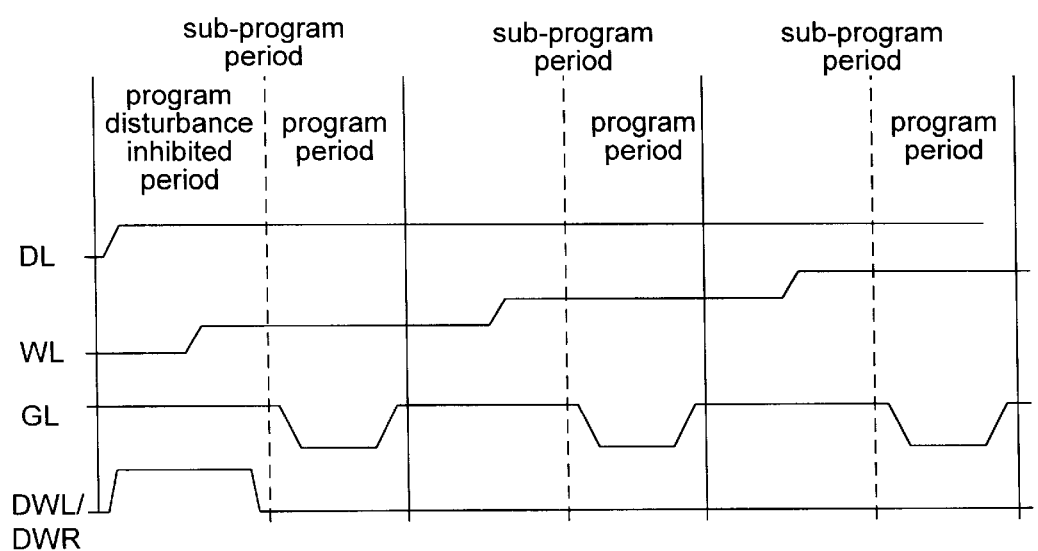
FIG. 4(b) illustrates the programming waveforms according to a second embodiment of the present invention.

Note that the source voltage is ramped down to execute programming for each sub-program period and the wordline voltage is increased for each sub-program period in order to improve programming speed. An alternate programming sequence is illustrated in FIG. 4(b). In the modified programming sequence, only the first sub-program period keeps the program disturbance inhibited period. The remaining sub-program periods only use the program period (DWL/DWR is low). The advantages associated with the ramping down of the source voltage and increasing the gate voltage are unchanged.

Figure 5:
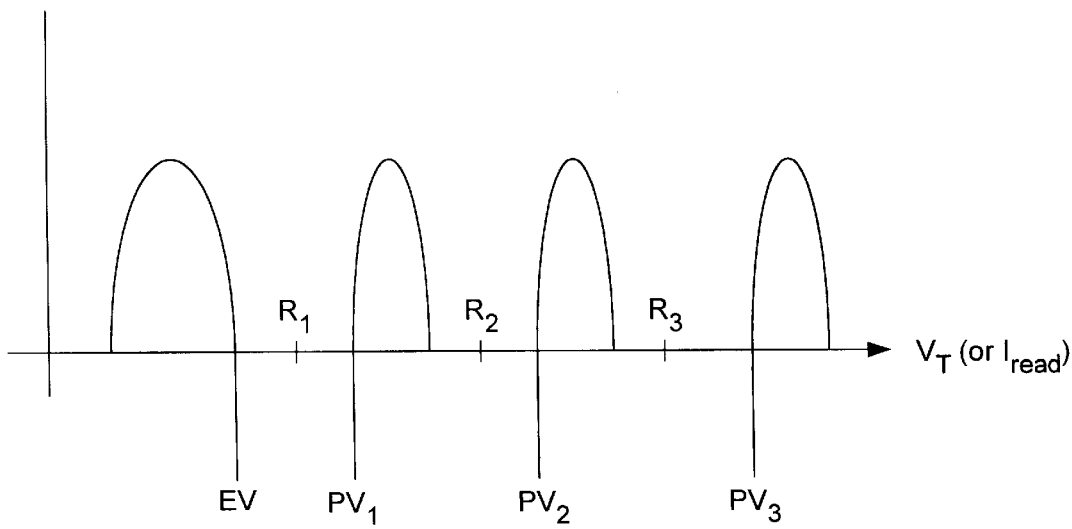
FIG. 5 is a graph of Vt for storing two bits per cell.
Figure 6:
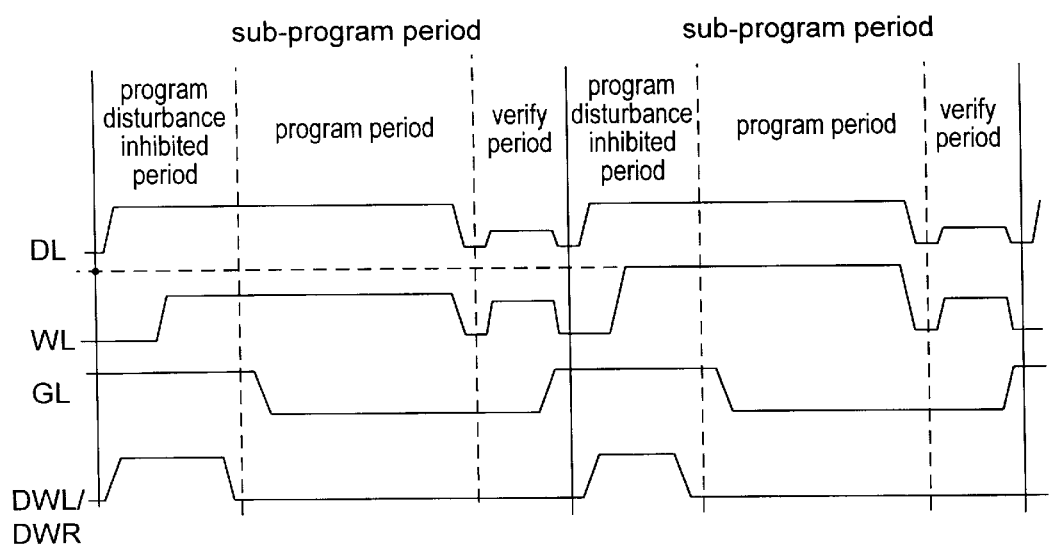
FIG. 6 is illustrates the programming waveforms of the multi-level programming method of the present invention.

In order to store more that one bit in one cell, the Vt control has to be very precise. For example, FIG. 5 illustrates 4 Vt levels per cell (i.e. two bit per cell). In order to program the cells to the desired level and keep the Vt distribution tight, the program and verify approach is adopted. The multilevel programming method according to the present invention is shown in FIG. 6, wherein the complete program period can be divided into sub-program periods. Each sub-program period is divided into a program disturbance inhibited period, a program period and a verify period. The program disturbance inhibited periods and program periods are the same as described above. The wordline voltage is the incremental type and the verify period is similar to a read operation. For example, the drain voltage is biased at 1.2V and the gate voltage is biased at 5V. However the reference levels during the program period are defined to be PV1, PV2 and PV3, instead of R1, R2 and R3, in order to improve read margins.

Thus, a new fast programming method and a new multi-level programming method have been disclosed which combine the advantages of ramping down the source voltage with increasing gate voltage. Those skilled in the art will appreciate that various adaptations and modifications of the just-described preferred embodiment can be configured without departing from the scope and spirit of the invention. Therefore, it is to be understood that, within the scope of the appended claims, the invention may be practiced other than as specifically described herein.

What is claimed is:

1. A method for programming a memory cell in a memory device, the method comprising:
   dividing a programming period into a program disturbance inhibited period and a program period;
   wherein during the program disturbance inhibited period, the method comprises:
   (a) setting a ground line GL high;
   (b) setting dummy word lines DWR, DWL and corresponding block selection lines (BWL) to prevent programming disturbance to adjacent memory cells;
   (c) setting a data line DL high; and
   (d) setting a wordline WL high; and
   wherein during the program period, the method comprises:
   (e) setting the dummy word lines DWR and DWL low;
   (f) setting the ground line GL low; and
   (g) turning on the corresponding BWL to program the memory cell.

2. The method of claim 1, wherein the dummy word lines DWR, DWL and the corresponding BWLs are set in the program disturbance inhibited period, depending on the cell to be programmed: wherein a program disturbance inhibited period for C0.0 occurs when, BWLn0, BWLn3, and DWR are off and BWLn1, BWLn2, and DWL are on; and wherein a program disturbance inhibited period for C0.1 occurs when. BWLn1, BWLn3, and DWR are off, and BWLn0, BWLn2, and DWL are on; and wherein a program disturbance inhibited period for C0.2 occurs when, BWLn1, BWLn2, DWL are off and BWLn0, BWLn3, and DWR are on; and wherein a program disturbance inhibited period for C0.2 occurs when. BWLn0, BWLn2, and DWR are off and BWLn1, BWLn3, and DWL are on.

3. The method of claim 2, wherein the corresponding BWL is turned on during the program period: wherein when C0.0 is to be programmed BWLn0 and BWLn2 are on and BWLn1 and BWLn3 are off, and wherein when C0.1 is to be programmed BWLn1 and BWLn2 are on and BWLn0 and BWLn3 are off, and wherein when C0.2 is to be programmed BWLn1 and BWLn3 are on and BWLn0 and BWLn2 are off, and wherein when C0.3 is to be programmed BWLn0 and BWLn3 are on and BWLn1 and BWLn2 are off.

4. The method of claim 3, wherein a plurality of programming periods are combined to form a plurality of sub-program periods, each sub-program period comprising a program disturbance inhibited period and a program period.

5. The method of claim 4, wherein the wordline WL has a voltage wherein the wordline WL voltage is increased for each sub-program period.

6. The method of claim 5, wherein a program disturbance inhibited period is only performed for the first sub-program period.

7. The method of claim 4, wherein each sub-program period further comprises a verify period.

8. The method of claim 3, wherein the memory device is a virtual ground EPROM.

9. The method of claim 3, wherein the memory device is a virtual ground Flash EPROM.

10. A method of programming a memory cell C0,0 without disturbing an adjacent memory cell C0,1, the method having a programming period including a program disturbance inhibited period and a program period, the method comprising:
    charging a drain side of C0,0 to a high level;
    charging a drain side of C0,1 to a high level;
    charging a source side of C0,1 to a high level; and
    pulling down a source side of C0,0 to initialize the program period.

11. The method of claim 10, wherein the drain sides of C0,0 and C0,1 are charged to a high level by turning on a corresponding block selection line (BWL).

12. The method of claim 11, wherein the source side of C0,1 is charged by turning on a corresponding BWL line and a dummy word line DWL.

13. The method of claim 12, wherein during a program period dummy word lines DWL and DWR are low, and a corresponding BWL line is turned on.

14. The method of claim 13, wherein a plurality of programming periods are combined to form a plurality of sub-program periods, each sub-program period comprising a program disturbance inhibited period and a program period.

15. The method of claim 14, wherein a wordline WL voltage is increased for each sub-program period.

16. The method of claim 15, wherein the program disturbance inhibited period is only performed for the first sub-program period.

17. The method of claim 14, wherein the sub-program period further comprises a verify period.

18. The method of claim 14, wherein the memory cell is in a virtual ground EPROM.

19. A multi-level programming method for multi-level Flash EPROMs, the method comprising:
    dividing a programming period into a program disturbance inhibited period, a program period, and a verify period;
    wherein during the program disturbance inhibited period, the method comprises:

(a) setting a ground line GL high;
(b) setting dummy word lines DWR, DWL and corresponding block selection lines (BWL) to prevent programming disturbance to adjacent memory cells;
(c) setting a data line DL high; and
(d) setting a wordline WL high;

and wherein during the program period, the method comprises:
(e) setting the dummy word lines DWR and DWL low;
(f) setting the ground line GL low; and
(g) turning on the corresponding BWL to program the memory cell;

and wherein during a verify period a read operation is performed to determine a value stored in the memory cell, such that the sub-program periods are performed until an appropriate value is stored in the memory cell.

20. The method of claim 19, wherein the wordline voltage increases for each sub-program period.

21. The method of claim 20, wherein during a verify period, an alternate set of reference values are used, instead of a normal set of read reference values.

22. A method for programming a memory cell without disturbing an adjacent cell, the method comprising:

performing a program disturbance inhibited operation to prevent programming disturbance to an adjacent cell; and performing a program operation to program the memory cell, wherein the program operation comprises:
ramping down a source voltage; and
increasing a gate voltage.

23. The method of claim 22, wherein a verify operation is performed after each program operation to determine if an appropriate value has been stored in the memory cell.

24. The method of claim 23, wherein the program disturbance inhibited operation and the program operation are repeated until the verify operation determines that an appropriate value has been stored in the memory cell.

* * * * *